US012094966B2

(12) United States Patent
Matsunaga

(10) Patent No.: US 12,094,966 B2
(45) Date of Patent: Sep. 17, 2024

(54) SILICON CARBIDE SEMICONDUCTOR DEVICE

(71) Applicant: FUJI ELECTRIC CO., LTD., Kawasaki (JP)

(72) Inventor: Shinichiro Matsunaga, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 444 days.

(21) Appl. No.: 17/566,409

(22) Filed: Dec. 30, 2021

(65) Prior Publication Data

US 2022/0254919 A1 Aug. 11, 2022

(30) Foreign Application Priority Data

Feb. 5, 2021 (JP) ................................. 2021-017046

(51) Int. Cl.
*H01L 29/78* (2006.01)
*H01L 29/10* (2006.01)
*H01L 29/16* (2006.01)

(52) U.S. Cl.
CPC ...... *H01L 29/7806* (2013.01); *H01L 29/1095* (2013.01); *H01L 29/1608* (2013.01); *H01L 29/7813* (2013.01)

(58) Field of Classification Search
CPC ............. H01L 29/7806; H01L 29/1095; H01L 29/1608; H01L 29/7813; H01L 29/66068; H01L 29/0603; H01L 29/0623; H01L 29/0878; H01L 29/872
See application file for complete search history.

(56) References Cited

U.S. PATENT DOCUMENTS

| | | | |
|---|---|---|---|
| 6,271,084 B1 * | 8/2001 | Tu | H01L 28/60 257/E21.59 |
| 9,548,266 B2 * | 1/2017 | Ajuria | H01L 24/02 |
| 9,659,998 B1 * | 5/2017 | Lung | H10N 70/021 |
| 9,899,372 B1 * | 2/2018 | Bi | H01L 28/82 |
| 10,395,984 B2 * | 8/2019 | Backes | H01L 23/528 |
| 10,505,111 B1 * | 12/2019 | Ok | H01L 21/7682 |

(Continued)

FOREIGN PATENT DOCUMENTS

| | | |
|---|---|---|
| JP | 2014-187320 A | 10/2014 |
| JP | 6416143 B2 | 10/2018 |
| JP | 6710589 B2 | 6/2020 |

*Primary Examiner* — Caleb E Henry
(74) *Attorney, Agent, or Firm* — Rabin & Berdo, P.C.

(57) ABSTRACT

A silicon carbide semiconductor device includes a silicon carbide semiconductor substrate of a first conductivity type, a first semiconductor layer of the first conductivity type, a second semiconductor layer of a second conductivity type, first semiconductor regions of the first conductivity type, second semiconductor regions of the second conductivity type, third semiconductor regions of the second conductivity type, provided in the second semiconductor layer at positions facing the first semiconductor regions in a depth direction and having an impurity concentration higher than an impurity concentration of the second semiconductor layer, trenches, gate insulating films, gate electrodes, a first electrode, a second electrode, and third electrodes. The third electrodes form Schottky junctions with the second semiconductor layer and are provided on the surface of portions of the second semiconductor layer free of the third semiconductor regions.

5 Claims, 11 Drawing Sheets

(56) References Cited

U.S. PATENT DOCUMENTS

| | | | |
|---|---|---|---|
| 10,510,951 B1* | 12/2019 | Yu | H10N 70/801 |
| 2007/0215852 A1* | 9/2007 | Lung | H10N 70/8413 |
| | | | 257/4 |
| 2007/0232015 A1* | 10/2007 | Liu | H10N 70/011 |
| | | | 257/E21.589 |
| 2008/0061282 A1* | 3/2008 | Sato | H10N 70/011 |
| | | | 438/102 |
| 2008/0116437 A1* | 5/2008 | Oh | H10N 70/8828 |
| | | | 257/E47.001 |
| 2008/0197335 A1* | 8/2008 | Yu | H10N 70/8265 |
| | | | 438/102 |
| 2008/0280390 A1* | 11/2008 | Kim | H10B 63/30 |
| | | | 438/95 |
| 2008/0303014 A1* | 12/2008 | Goux | H10N 70/043 |
| | | | 438/102 |
| 2011/0155993 A1* | 6/2011 | Chen | H10N 70/8828 |
| | | | 438/102 |
| 2012/0119177 A1* | 5/2012 | Erbetta | H10N 70/8828 |
| | | | 257/E21.52 |
| 2012/0305872 A1* | 12/2012 | Yoon | H10N 70/882 |
| | | | 257/532 |
| 2014/0138604 A1* | 5/2014 | Liu | H10N 70/231 |
| | | | 257/4 |
| 2014/0284658 A1 | 9/2014 | Matsudai et al. | |
| 2017/0062714 A1* | 3/2017 | Kau | H10N 70/8616 |
| 2017/0271437 A1 | 9/2017 | Kono et al. | |
| 2017/0365709 A1 | 12/2017 | Ohashi et al. | |
| 2018/0342390 A1* | 11/2018 | Xiao | C23C 16/56 |
| 2019/0088474 A1* | 3/2019 | MacDonald | C07F 7/10 |
| 2019/0189688 A1* | 6/2019 | Lille | H10N 70/826 |
| 2020/0010954 A1* | 1/2020 | Bhuyan | C23C 16/401 |
| 2020/0152870 A1* | 5/2020 | Lin | H10N 70/8828 |
| 2020/0194670 A1* | 6/2020 | Allegra | H10N 70/841 |
| 2020/0219933 A1* | 7/2020 | Cheng | H10N 70/841 |
| 2021/0098532 A1* | 4/2021 | Wu | H10N 70/826 |
| 2022/0044929 A1* | 2/2022 | Xiao | C23C 16/401 |

* cited by examiner

SILICON CARBIDE SEMICONDUCTOR DEVICE

CROSS REFERENCE TO RELATED APPLICATIONS

This application is based upon and claims the benefit of priority of the prior Japanese Patent Application No. 2021-017046, filed on Feb. 5, 2021, the entire contents of which are incorporated herein by reference.

BACKGROUND OF THE INVENTION

1. Field of the Invention

Embodiments of the invention relate to a silicon carbide semiconductor device.

2. Description of the Related Art

Silicon carbide (SiC) is expected to replace silicon (Si) as a next generation semiconductor material. Compared to a conventional semiconductor device in which silicon is used as a semiconductor material, a semiconductor device in which silicon carbide is used as a semiconductor material (hereinafter, silicon carbide semiconductor device) has various advantages as such as enabling use under higher temperature environments (at least 200 degrees C.) and reducing device resistance in an ON state to one of a few hundredths of that of the conventional semiconductor device. These advantages are due to characteristics of the material itself such as the bandgap of silicon carbide being about three times that of silicon and dielectric breakdown electric field strength being nearly ten times greater than that of silicon.

As silicon carbide semiconductor devices, Schottky barrier diodes (SBDs) and vertical metal oxide semiconductor field effect transistors (MOSFETs) having a planar gate structure or a trench gate structure have been made into products.

A planar gate structure is a metal oxide semiconductor (MOS) gate structure in which a MOS gate is provided in a flat plate-like shape on the front surface of a semiconductor substrate. A trench gate structure is a MOS gate structure in which a MOS gate is embedded in a trench formed in a semiconductor substrate (semiconductor chip) at a front surface of the semiconductor substrate and in which a channel (inversion layer) is formed along sidewalls of the trench, in a direction orthogonal to the front surface of the semiconductor substrate. Therefore, compared to a planar gate structure in which a channel is formed along the front surface of the semiconductor substrate, unit cell (constituent unit of a device element) density per unit area may be increased and current density per unit area may be increased, which is advantageous in terms of cost.

FIG. 17 is a cross-sectional view depicting a structure of a conventional silicon carbide semiconductor device. The structure of the conventional silicon carbide semiconductor device is described taking a trench-type MOSFET 170 as an example. In the trench-type MOSFET 170, an $n^-$-type silicon carbide epitaxial layer 102 is deposited on a front surface of an $n^+$-type silicon carbide substrate 101. On a first surface of the $n^-$-type silicon carbide epitaxial layer 102 opposite to a second surface thereof facing the $n^+$-type silicon carbide substrate 101, an n-type high-concentration region 105 is provided. In the n-type high-concentration region 105, a first $p^+$-type base region 103 is provided so as to cover an entire area of a bottom of a trench 116.

A MOS gate having a trench gate structure is configured by a p-type base layer 106, an $n^+$-type source region 107, a $p^+$-type contact region 108, the trench 116, a gate insulating film 109, and a gate electrode 110. The $p^+$-type contact region 108 may be omitted. Hereinafter, the $n^+$-type silicon carbide substrate 101, the $n^-$-type silicon carbide epitaxial layer 102, the n-type high-concentration region 105, and the p-type base layer 106 combined are regarded as a silicon carbide semiconductor base 118.

Further, an interlayer insulating film 111 is provided on the gate electrode 110 and in an opening in the interlayer insulating film 111, a source electrode 112 in contact with the $n^+$-type source region 107 and the $p^+$-type contact region 108 is provided. A back electrode 113 constituting a drain electrode is provided on a back surface of the $n^+$-type silicon carbide substrate 101.

In the trench-type MOSFET 170 having such a structure, to adjust a threshold voltage (Vth), ion implantation (hereinafter, channel implantation) is performed in a portion of the p-type base layer 106 forming a channel. As a result, a channel implant portion 120 having an impurity concentration higher than an impurity concentration of the p-type base layer 106 is formed. In a MOSFET, as the threshold voltage increases, a possibility of erroneous turning ON due to electromagnetic noise, etc. decreases and thus, due to this channel implantation, electron current does not easily pass, and the threshold voltage (channel inversion voltage) is increased.

Further, a semiconductor device is known that achieves increased diode switching speed, reduced low-current oscillation, and reduced recovery loss by adjusting carrier concentration, without performing lifetime control (for example, refer to Japanese Laid-Open Patent Publication No. 2014-187320).

Further, a semiconductor device is known in which a first stopper region having a p-type impurity concentration that is from two times to 100 times more than a p-type impurity concentration of a first channel region is provided at a position adjacent to the first channel region to enhance MOSFET avalanche capability (for example, refer to Japanese Patent No. 6416143).

Further, a semiconductor device is known that is capable of enhancing breakdown voltage of a gate insulating layer by nearly completely suppressing entry of equipotential lines from a drift region to a p-well region by providing a high-concentration p-region in the p-well region (for example, refer to Japanese Patent No. 6710589).

SUMMARY OF THE INVENTION

According to an embodiment of the invention, a silicon carbide semiconductor device includes: a silicon carbide semiconductor substrate of a first conductivity type, having a first main surface and a second main surface opposite to each other; a first semiconductor layer of the first conductivity type, provided on the first main surface of the silicon carbide semiconductor substrate, the first semiconductor layer having an impurity concentration lower than an impurity concentration of the silicon carbide semiconductor substrate, the first semiconductor layer having a first surface and a second surface opposite to each other, the second surface facing the silicon carbide semiconductor substrate; a second semiconductor layer of a second conductivity type, provided on the first surface of the first semiconductor layer, the second semiconductor layer having a first surface and a second surface opposite to each other, the second surface of the second semiconductor layer facing the first semiconductor layer; a plurality of first semiconductor regions of the first conductivity type, selectively provided in a surface layer of the second semiconductor layer at the first surface of the second semiconductor layer; a plurality of second semiconductor regions of the second conductivity type, selectively provided in the surface layer of the second semiconductor layer, in contact with first semiconductor regions; a plurality of third semiconductor regions of the second conductivity type, respectively provided at positions facing the first semiconductor regions of the second semiconductor layer in the depth direction, the third semiconductor regions each having an impurity concentration higher than an impurity concentration of the second semiconductor layer; a plurality of trenches penetrating through the first semiconductor regions and the second semiconductor layer, and reaching the first semiconductor layer; a plurality of gate electrodes respectively provided in the trenches via gate insulating films; an interlayer insulating film provided on the gate electrodes; a first electrode provided on surfaces of the first semiconductor regions and the second semiconductor regions; a second electrode provided on the second main surface of the silicon carbide semiconductor substrate; and a plurality of third electrodes provided on the first surface of portions of the second semiconductor layer free of the third semiconductor regions, each of the third electrodes forming a Schottky junction with the second semiconductor layer.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
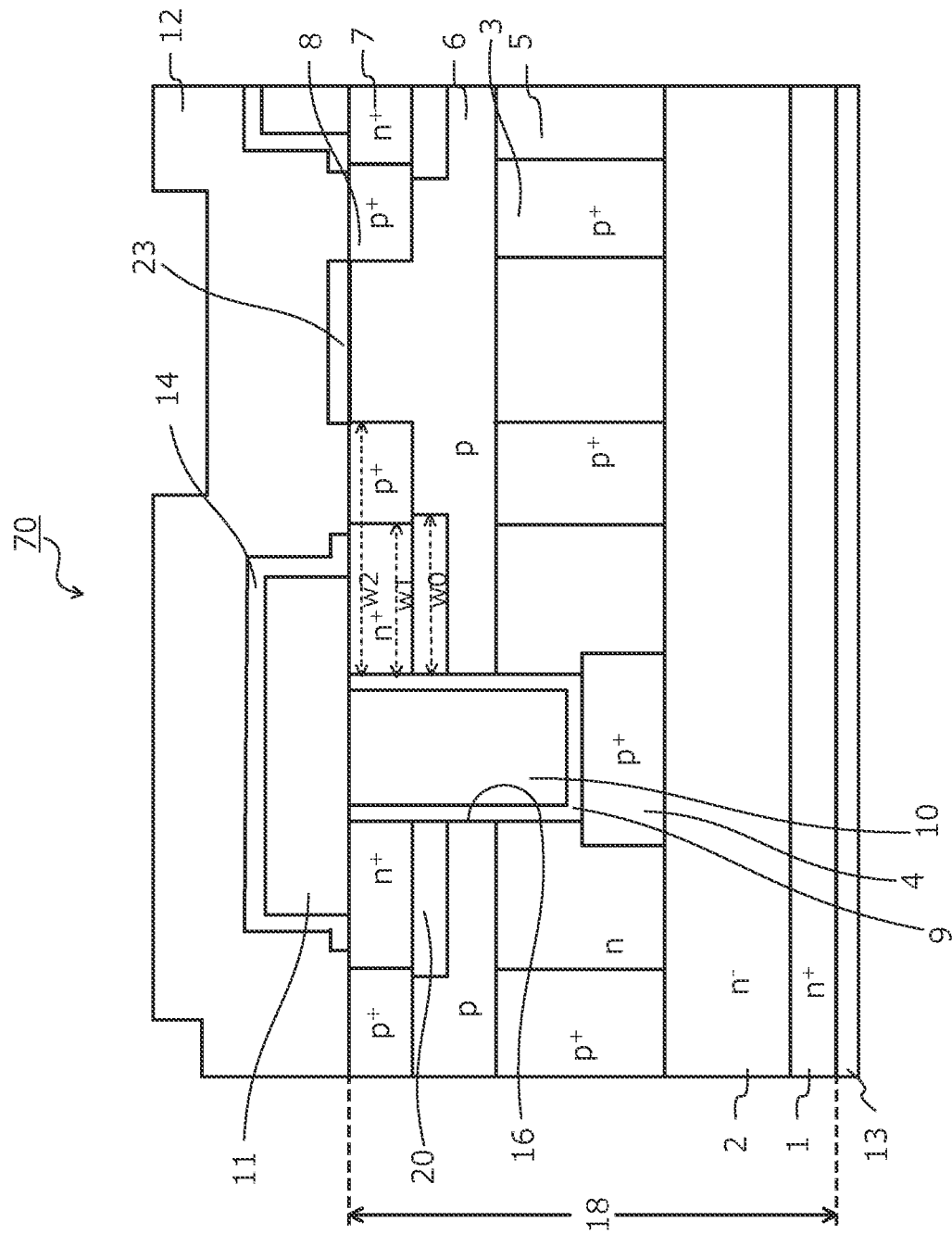
FIG. 1 is a cross-sectional view depicting a structure of a silicon carbide semiconductor device according to a first embodiment.

First, problems associated with the conventional techniques are discussed. Here, in the conventional trench-type MOSFET 170, the channel implantation is performed in an entire area of a surface of the silicon carbide semiconductor base 118, from an upper surface side (side having the source electrode 112) of the silicon carbide semiconductor base 118. As a result, the channel implantation is further performed in regions separate from the channel, whereby the channel implant portion 120 having a high impurity concentration is provided in an entire area of the surface of the p-type base layer 106. Here, during reverse conduction operation by application of a high potential to the source electrode 112, current flows in a direction from the p$^+$-type contact region 108, through the p-type base layer 106 and the n$^-$-type silicon carbide epitaxial layer 102, to the n$^+$-type silicon carbide substrate 101.

At this time, due to the channel implant portion 120, electron current does not easily penetrate the p-type base layer 106, the ratio of electron current to the total current decreases, and the amount of holes accumulated in the drift layer of the same current density increases. When the amount of holes in the drift layer increases, recombination of the holes and electrons in the drift layer tends to occur. When this occurs and the crystal of the n$^+$-type silicon carbide substrate 101 has defects, generated recombination energy (3 eV) equivalent to the bandgap causes movement of basal plane dislocations (BPDs), which are one type of crystal defects present in the n$^+$-type silicon carbide substrate 101, and single Shockley stacking faults (1SSFs) between two basal plane dislocations expand. When a stacking fault expands, ON resistance of the MOSFET and forward voltage of the diode increase because current does not easily pass through the stacking fault. In this manner, a problem arises in that bipolar degradation occurs in the trench-type MOSFET 170 due to the channel implantation.

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "-" means a bar added to an index immediately after the "-", and a negative index is expressed by prefixing "-" to the index. Further, with consideration of variation in manufacturing, description indicating the same or equal may be within 5%.

A semiconductor device according to the invention is configured using a wide band gap semiconductor. In a first embodiment, a silicon carbide semiconductor device fabricated (manufactured) using, for example, silicon carbide (SiC) as a wide band gap semiconductor is described taking a trench-type MOSFET 70 as an example. FIG. 1 is a cross-sectional view depicting a structure of the silicon carbide semiconductor device according to the first embodiment. In FIG. 1, only an active region through which a main current of the trench-type MOSFET 70 flows is depicted.

As depicted in FIG. 1, in the silicon carbide semiconductor device according to the first embodiment, an n$^-$-type silicon carbide epitaxial layer (first semiconductor layer of the first conductivity type) 2 is deposited on a first main surface (front surface), for example, a (0001)-plane (Si-face) of an n$^+$-type silicon carbide substrate (silicon carbide semiconductor substrate of a first conductivity type) 1.

The n$^+$-type silicon carbide substrate 1 is a silicon carbide single crystal substrate. The n$^-$-type silicon carbide epitaxial layer 2 has an impurity concentration lower than an impurity concentration of the n$^+$-type silicon carbide substrate 1 and, for example, is a low-concentration n-type drift layer. At a first surface of the n$^-$-type silicon carbide epitaxial layer 2, opposite to a second surface thereof facing the n$^+$-type silicon carbide substrate 1, n-type high-concentration regions 5 may be provided in the n$^-$-type silicon carbide epitaxial layer 2. The n-type high-concentration regions 5 constitute a high-concentration n-type drift layer having an impurity concentration lower than the impurity concentration of the n$^+$-type silicon carbide substrate 1 and higher than the impurity concentration of the n$^-$-type silicon carbide epitaxial layer 2.

On the first surface of the n$^-$-type silicon carbide epitaxial layer 2, opposite to the second surface thereof facing the n$^+$-type silicon carbide substrate 1, a p-type base layer (second semiconductor layer of a second conductivity type) 6 is provided. Hereinafter, the n$^+$-type silicon carbide substrate 1, the n$^-$-type silicon carbide epitaxial layer 2, the n-type high-concentration regions 5, and the p-type base layer 6 combined are regarded as a silicon carbide semiconductor base (semiconductor substrate containing silicon carbide) 18.

On a second main surface (back surface, i.e., back surface of the silicon carbide semiconductor base 18) of the n$^+$-type silicon carbide substrate 1, a drain electrode constituting a back electrode (second electrode) 13 is provided. On a surface of the back electrode 13, a drain electrode pad (not depicted) is provided.

At a first main surface side (side having the p-type base layer 6) of the silicon carbide semiconductor base 18, a trench structure is formed. In particular, trenches 16 penetrate through the p-type base layer 6 from a first surface (first main surface side of the silicon carbide semiconductor base 18) of the p-type base layer 6 and reach the n-type high-concentration regions 5 (in an instance in which the n-type high-concentration regions 5 are omitted, the n$^-$-type silicon carbide epitaxial layer 2, hereinafter, simply "(2)"), the first surface of the p-type base layer 6 being opposite to a second surface of the p-type base layer 6 facing the n$^+$-type silicon carbide substrate 1. Along inner walls of the trenches 16, gate insulating films 9 are formed on bottoms and sidewalls of the trenches 16 and gate electrodes 10 are formed on the gate insulating films 9 in the trenches 16. The gate electrodes 10 are insulated from the n-type high-concentration regions 5 (2) and the p-type base layer 6 by the gate insulating films 9. The gate electrodes 10 may partially protrude toward a later-described source electrode (first electrode) 12, from tops (sides where the source electrode 12 is provided) of the trenches 16.

In surface layers of the n-type high-concentration regions 5 (2), at first surfaces thereof (first main surface side of the silicon carbide semiconductor base 18) opposite to second surfaces thereof facing the n$^+$-type silicon carbide substrate 1, first p$^+$-type base regions (fourth semiconductor regions of the second conductivity type) 3 are provided between the trenches 16. Further, in the n-type high-concentration regions 5 (2), second p$^+$-type base regions (fifth semiconductor regions of the second conductivity type) 4 in contact with the bottoms of the trenches 16, respectively, are provided. The second p$^+$-type base regions 4 are provided at positions facing the bottoms of the trenches 16 in a depth direction (direction from the source electrode 12 to the drain electrode 13). A width of the second p$^+$-type base regions 4 is equal to or wider than a width of each of the trenches 16. The bottoms of the trenches 16 may reach the second p$^+$-type base regions 4 or may be positioned in the n-type high-concentration regions 5 (2), between the p-type base layer 6 and the second p$^+$-type base regions 4.

In the p-type base layer 6, n$^+$-type source regions (first semiconductor regions of the first conductivity type) 7 and p$^+$-type contact regions (second semiconductor regions of the second conductivity type) 8 are selectively provided at the first main surface side of the silicon carbide semiconductor base 18. Further, the n$^+$-type source regions 7 and the p$^+$-type contact regions 8 are in contact with one another.

Here, to adjust a threshold voltage (Vth), ion implantation (hereinafter, channel implantation) is performed in portions of the p-type base layer 6 where a channel is formed. As a result, channel implant portions (third semiconductor regions of the second conductivity type) 20 having an impurity concentration higher than an impurity concentration of the p-type base layer 6 are formed.

In the first embodiment, the channel implantation is performed only in a shallow region close to a MOS channel and is not performed in a region separate from a MOS channel. Therefore, the channel implant portions 20 are formed only in vicinities of the sidewalls of the trenches 16. In particular, the channel implant portions 20 are in contact with the sidewalls of the trenches 16 and are provided at positions corresponding to the n$^+$-type source regions 7 in the depth direction (direction from the source electrode 12 to the back electrode 13). Further, preferably, a width w0 of each of the channel implant portions 20 may be greater than a width w1 of each of the n$^+$-type source regions 7 but less than a combined width w2 one of the n$^+$-type source regions 7 and one of the p$^+$-type contact regions 8.

Figure 2:
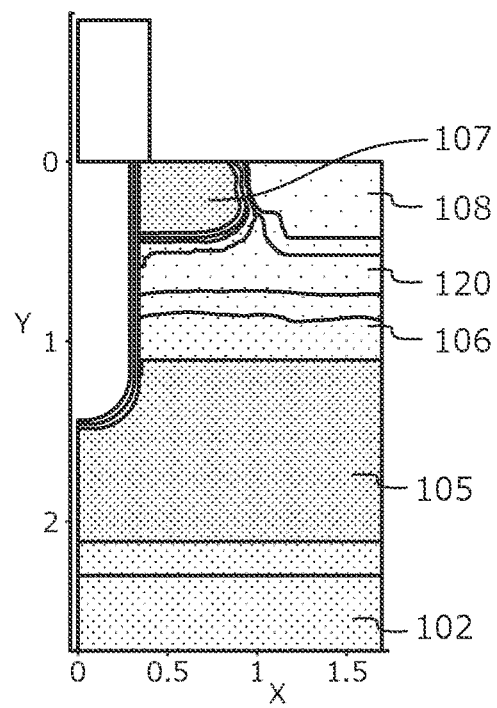
FIG. 2 is a cross-sectional view depicting an impurity profile of a conventional silicon carbide semiconductor device in which channel implantation is performed in an entire area of a surface.
Figure 3:
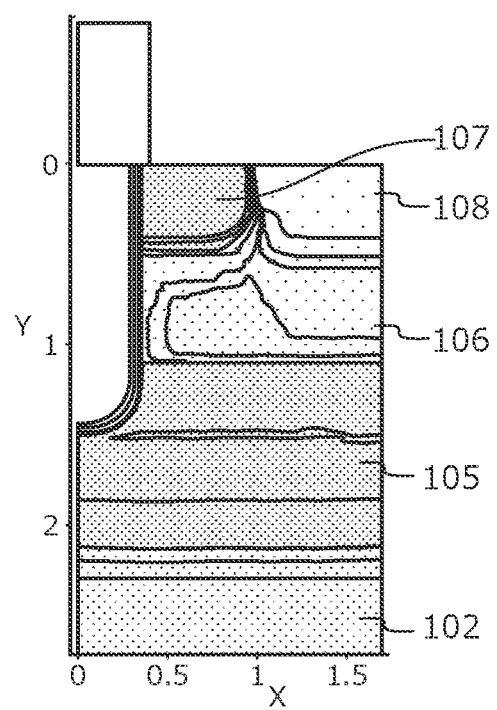
FIG. 3 is a cross-sectional view depicting an impurity profile of a conventional silicon carbide semiconductor device in which the channel implantation is not performed.
Figure 4:
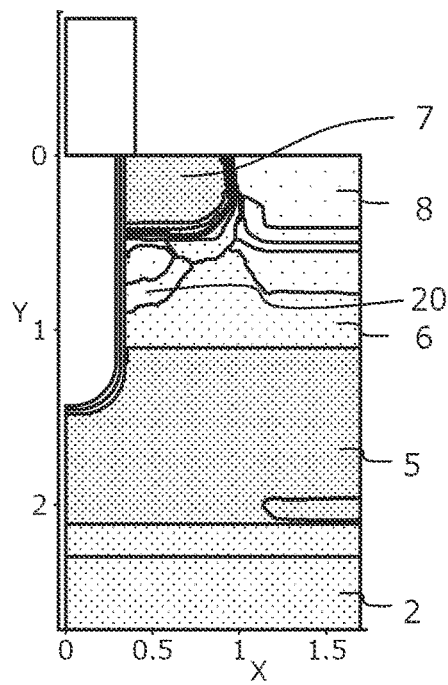
FIG. 4 is a cross-sectional view depicting an impurity profile of the silicon carbide semiconductor device according to the first embodiment.

Here, FIG. 2 is a cross-sectional view depicting an impurity profile of the conventional silicon carbide semiconductor device in which channel implantation is performed in an entire area of the surface. FIG. 3 is a cross-sectional view depicting an impurity profile of the conventional silicon carbide semiconductor device in which the channel implantation is not performed. FIG. 4 is a cross-sectional view depicting an impurity profile of the silicon carbide semiconductor device according to the first embodiment.

As depicted in FIG. 2, in the conventional silicon carbide semiconductor device in which the channel implantation is performed in an entire area of the surface, the channel implant portion 120 having a high impurity concentration is beneath the $n^+$-type source region 107 and the $p^+$-type contact region 108. As depicted in FIG. 3, in the conventional silicon carbide semiconductor device in which the channel implantation is not performed, the impurity concentration of a portion beneath the $n^+$-type source region 107 and the $p^+$-type contact region 108 is lower than in the conventional silicon carbide semiconductor device in which the channel implantation is performed in an entire area of the surface. In contrast, in the silicon carbide semiconductor device according to the first embodiment, the channel implant portions 20 having a high impurity concentration is provided only beneath the $n^+$-type source regions 7 and the impurity concentration beneath the $p^+$-type contact regions 8 is lower than that in the conventional silicon carbide semiconductor device in which the channel implantation is performed in an entire area of the surface.

In this manner, the channel implant portions 20 are provided only in vicinities of MOS channels, whereby in portions separate from the MOS channels, the impurity concentration of the p-type base layer 6 is lower and penetration of electron current is facilitated. During reverse conduction when greater negative potential is applied to the drain electrode than to the source electrode 12 and the direction of current reverses, the current flows in a direction from the $p^+$-type contact regions 8, through the p-type base layer 6 and the $n^-$-type silicon carbide epitaxial layer 2 to the $n^+$-type silicon carbide substrate 1. In this case, the impurity concentration of the p-type base layer 6 is lowered in portions separate from the MOS channels and therefore, electron current easily penetrates the p-type base layer 6 and electrons reaching the p-type base layer 6 may be led out.

Figure 5:
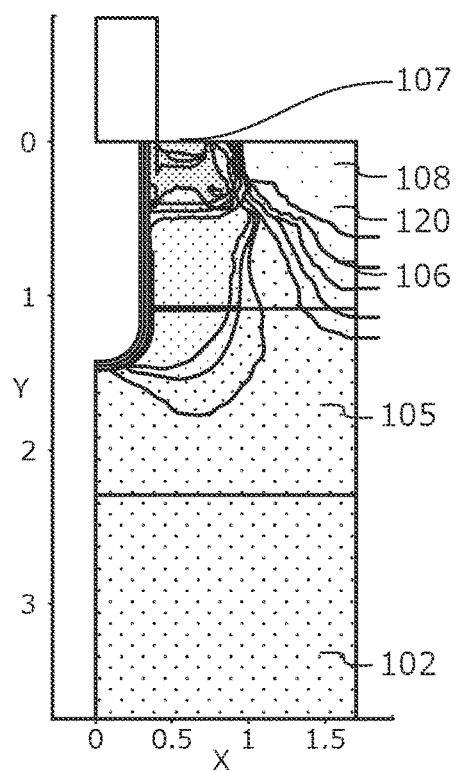
FIG. 5 is a cross-sectional view depicting electron current paths during reverse conduction of the conventional silicon carbide semiconductor device in which the channel implantation is performed in an entire area of the surface.
Figure 6:
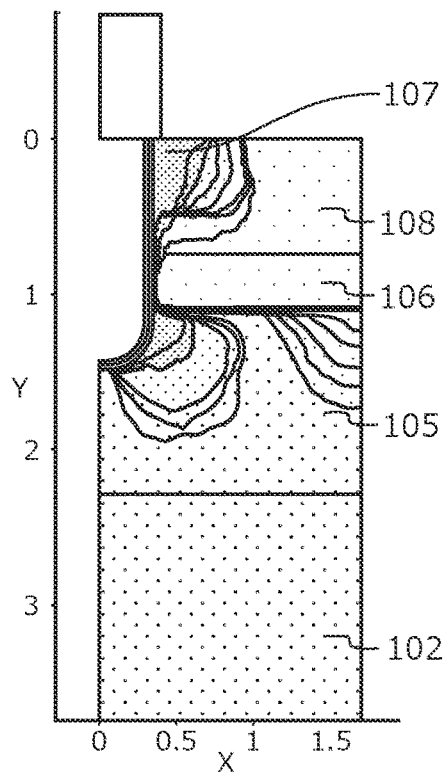
FIG. 6 is a cross-sectional view depicting electron current paths during reverse conduction of the conventional silicon carbide semiconductor device in which the channel implantation is not performed.
Figure 7:
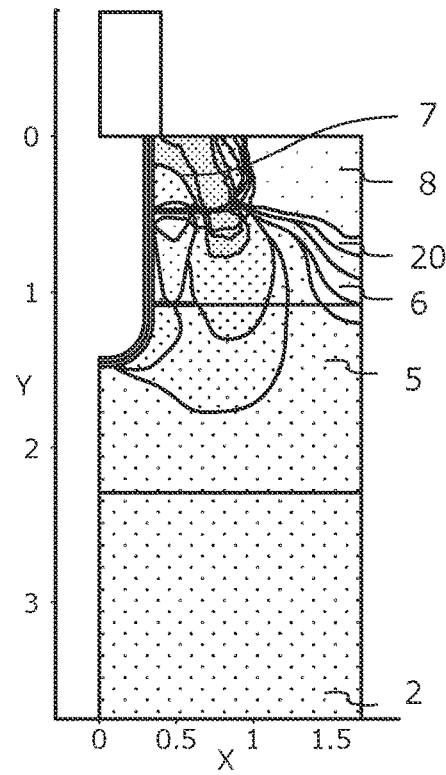
FIG. 7 is a cross-sectional view depicting electron current paths during reverse conduction of the silicon carbide semiconductor device according to the first embodiment.

FIG. 5 is a cross-sectional view depicting electron current paths during reverse conduction of the conventional silicon carbide semiconductor device in which the channel implantation is performed in an entire area of the surface. FIG. 6 is a cross-sectional view depicting electron current paths during reverse conduction of the conventional silicon carbide semiconductor device in which the channel implantation is not performed. FIG. 7 is a cross-sectional view depicting electron current paths during reverse conduction of the silicon carbide semiconductor device according to the first embodiment.

As depicted in FIGS. 5 and 6, it is found that in the conventional silicon carbide semiconductor devices, during reverse conduction, regions having the highest electron density (heavily hatched regions in FIGS. 5 and 6) do not reach the p-type base layer 106 and electron current does not easily penetrate through the p-type base layer 106. On the other hand, as depicted in FIG. 7, it is found that a region having the highest electron density (heavily hatched region in FIG. 7) reaches the p-type base layer 6 in the silicon carbide semiconductor device according to the first embodiment and electron current easily penetrates through the p-type base layer 6.

Figure 8:
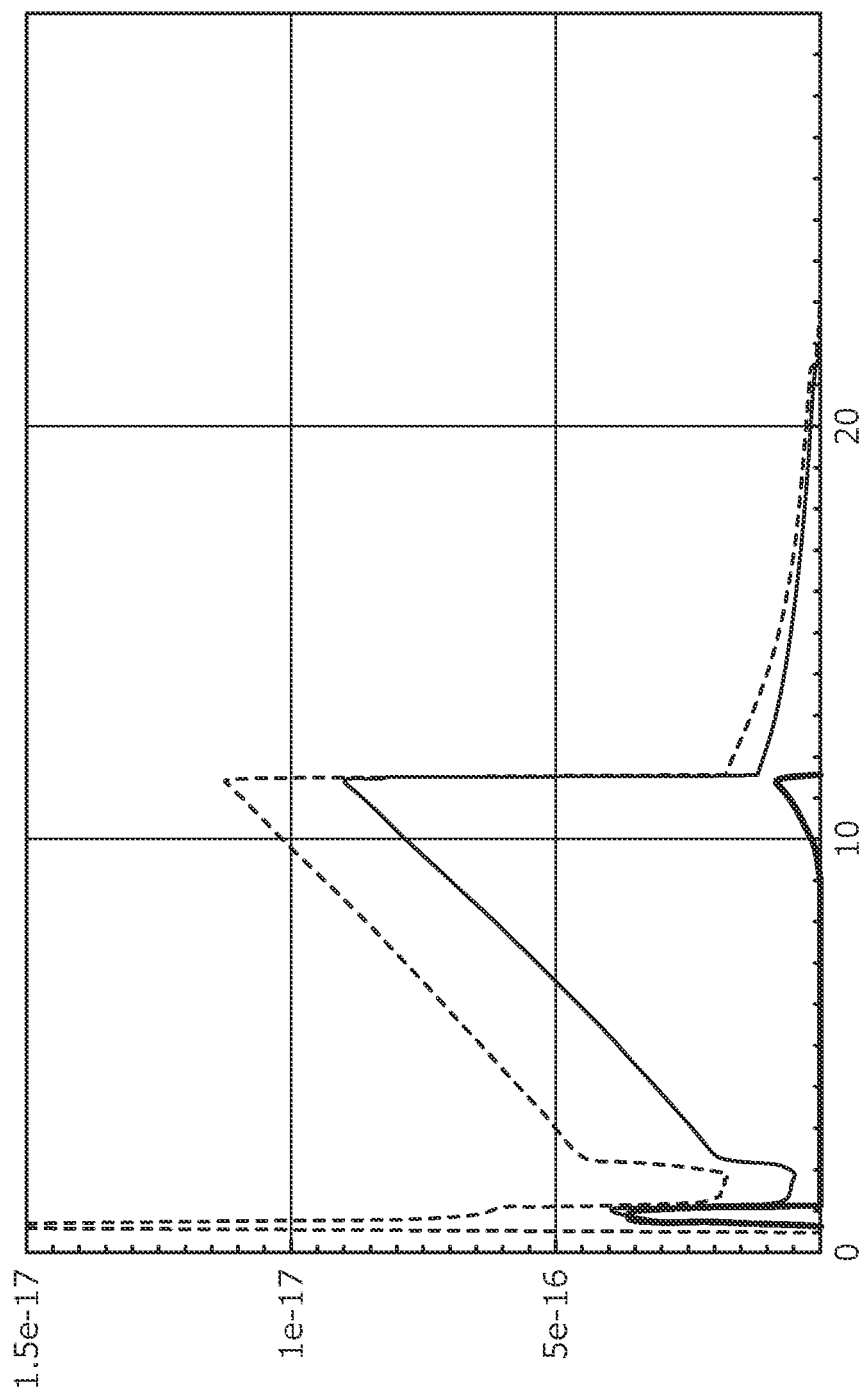
FIG. 8 is a graph depicting hole density of drift layers of the silicon carbide semiconductor device according to the first embodiment and the conventional silicon carbide semiconductor devices.

FIG. 8 is a graph depicting hole density of the drift layers of the silicon carbide semiconductor device according to the first embodiment and the conventional silicon carbide semiconductor devices. In FIG. 8, a vertical axis shows hole density in units of/cm³. A horizontal axis indicates depth from the surface (interface with the p-type base layer 6, 106) of the drift layer in units of μm. In FIG. 8, a dashed line indicates hole density of the drift layer of the conventional silicon carbide semiconductor device in which the channel implantation is performed in an entire area of the surface; a fine line indicates hole density of the drift layer of the conventional silicon carbide semiconductor device in which the channel implantation is not performed; and a thick line indicates hole density of the drift layer of the silicon carbide semiconductor device according to the first embodiment. As depicted in FIG. 8, in the silicon carbide semiconductor device according to the first embodiment, the channel implantation portions 20 are separate portions, whereby electron current flows in a vertical direction, the ratio of electron current to total current increases, and the accumulated hole amount may be reduced for the same current density.

In this manner, in a silicon carbide MOSFET according to the first embodiment, hole injection into the drift layer is suppressed, thereby enabling the occurrence of recombination of holes and electrons in the drift layer to be reduced; and the expansion of stacking faults is suppressed, thereby enabling bipolar degradation of the silicon carbide MOSFET to be suppressed.

Further, in the first embodiment, on portions of the p-type base layer 6 where the channel implantation is not performed, a Schottky metal (third electrodes) 23 forming a Schottky junction with the p-type base layer 6 is provided. For example, as depicted in FIG. 1, preferably, the Schottky metal 23 may be provided in regions between the $p^+$-type contact regions 8 between the trenches 16. Further, even in an instance in which the $p^+$-type contact regions 8 and the $n^+$-type source regions 7 are provided alternating one another in a longitudinal direction of the trenches 16, preferably, the Schottky metal 23 may be provided between the $p^+$-type contact regions 8. The Schottky metal 23 is not necessary in all the regions between the trenches 16 and preferably, may be provided in at least a portion of the regions between the trenches 16.

Figure 9:
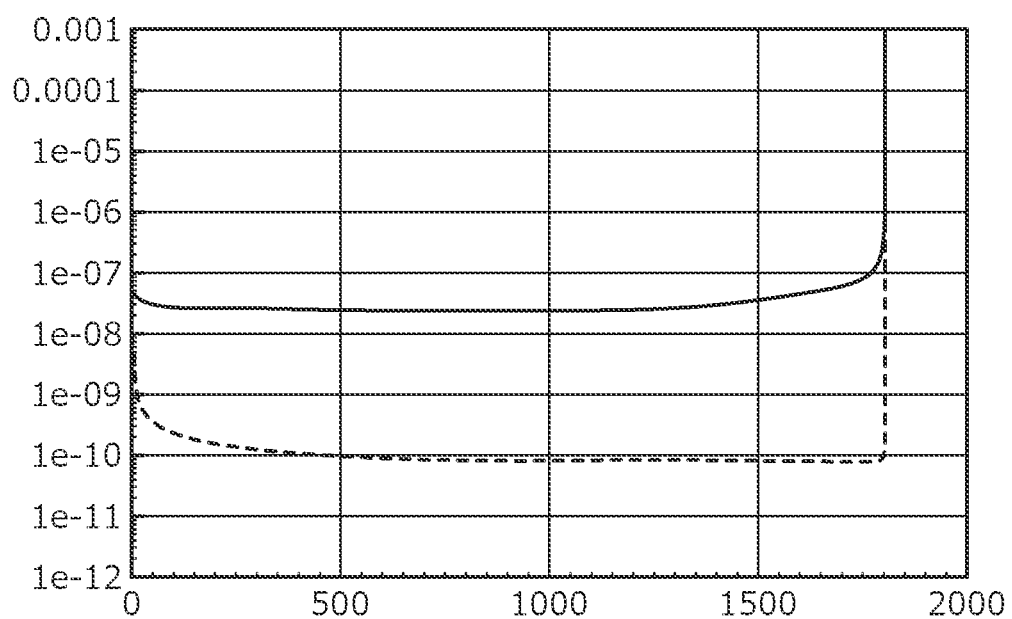
FIG. 9 is a graph depicting breakdown voltage of the silicon carbide semiconductor device according to the first embodiment.

FIG. 9 is a graph depicting breakdown voltage of the silicon carbide semiconductor device according to the first embodiment. In FIG. 9, a vertical axis indicates drain current in units of A. A horizontal axis indicates drain voltage in units of V. In FIG. 9, instances in which a barrier height of the Schottky metal 23 is 3V (solid line in FIG. 9) and 1V (dashed line in FIG. 9) are depicted. As depicted in FIG. 9, it is found that the breakdown voltage of the silicon carbide semiconductor device according to the first embodiment is about 1800V. In this manner, by providing the Schottky metal 23, an electrode that electron current reaches may be constituted by the Schottky metal 23, leak current during reverse bias is suppressed, and the breakdown voltage may be maintained.

An interlayer insulating film 11 is provided in an entire area of the first main surface side of the silicon carbide semiconductor base 18, so as to cover the gate electrodes 10 embedded in the trenches 16. The source electrode 12 is in contact with the $n^+$-type source regions 7 and the p-type base layer 6 via contact holes in the interlayer insulating film 11. Further, in an instance in which the $p^+$-type contact regions 8 are provided, the source electrode 12 is in contact with the $n^+$-type source regions 7, the p-type base layer 6, and the $p^+$-type contact regions 8. The source electrode 12 is electrically insulated from the gate electrodes 10 by the interlayer insulating film 11. On the source electrode 12, a source electrode pad (not depicted) is provided. Between the source electrode 12 and the interlayer insulating film 11, for example, a barrier metal 14 that prevents diffusion of metal atoms from the source electrode 12 to the gate electrodes 10 may be provided.

Next, a method of manufacturing the silicon carbide semiconductor device according to the first embodiment is described. FIGS. 10, 11, 12, 13, 14, and 15 are cross-sectional views depicting states of the silicon carbide semiconductor device according to the first embodiment during manufacture.

Figure 10:
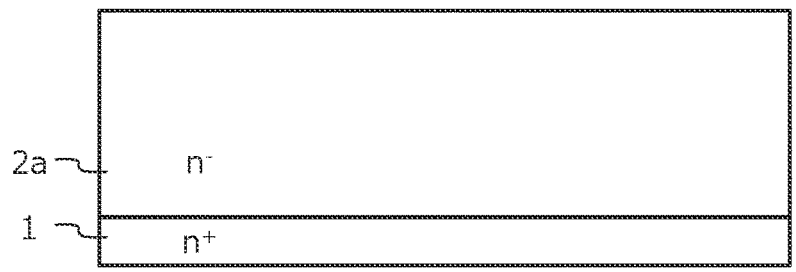
FIG. 10 is a cross-sectional view depicting a state of the silicon carbide semiconductor device according to the first embodiment during manufacture.

First, the n$^+$-type silicon carbide substrate 1 containing an n-type silicon carbide is prepared. Subsequently, on the first main surface of the n$^+$-type silicon carbide substrate 1, a lower n$^-$-type silicon carbide epitaxial layer 2a containing silicon carbide and having a thickness of, for example, about 30 μm is epitaxially grown while an n-type impurity, for example, nitrogen atoms (N) is doped. The state up to here is depicted in FIG. 10.

Next, an ion implantation mask having predetermined openings is formed by a photolithographic technique using, for example, an oxide film. Subsequently, a p-type impurity such as aluminum is implanted in the openings of the oxide film, whereby lower first p$^+$-type base regions 3a and the second p$^+$-type base regions 4 of a depth of about 0.5 μm are formed.

Figure 11:
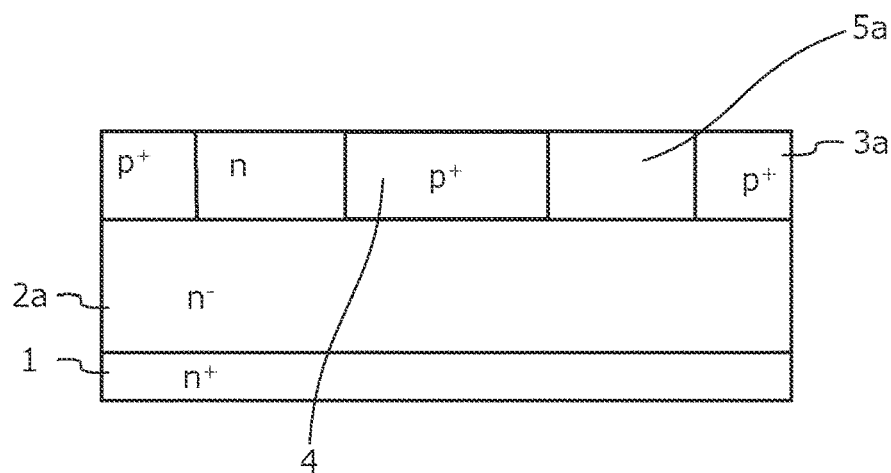
FIG. 11 is a cross-sectional view depicting a state of the silicon carbide semiconductor device according to the first embodiment during manufacture.

Next, portions of the ion implantation mask may be removed and an n-type impurity such as nitrogen may be ion-implanted in the openings, whereby in portions of a surface region of the lower n$^-$-type silicon carbide epitaxial layer 2a, lower n-type high-concentration regions 5a of a depth of, for example, about 0.5 μm may be formed. An impurity concentration of the lower n-type high-concentration regions 5a is set to be, for example, about $1\times10^{17}$/cm$^3$. The state up to here is depicted in FIG. 11.

Next, on the surface of the lower n$^-$-type silicon carbide epitaxial layer 2a, an upper n$^-$-type silicon carbide epitaxial layer 2b doped with an n-type impurity such as nitrogen and having a thickness of about 0.5 μm is formed. An impurity concentration of the upper n$^-$-type silicon carbide epitaxial layer 2b is set to be about $3\times10^{15}$/cm$^3$. Hereinafter, the lower n$^-$-type silicon carbide epitaxial layer 2a and the upper n$^-$-type silicon carbide epitaxial layer 2b combined constitute the n$^-$-type silicon carbide epitaxial layer 2.

Next, on the surface of the upper n$^-$-type silicon carbide epitaxial layer 2b, ion implantation mask having predetermined openings is formed by photolithography using, for example, an oxide film. Subsequently, a p-type impurity such as aluminum is implanted in the openings of the oxide film, whereby upper first p$^+$-type base regions 3b of a depth of about 0.5 μm are formed so as to overlap the lower first p$^+$-type base regions 3a, respectively. The lower first p$^+$-type base regions 3a and the upper first p$^+$-type base regions 3b overlapping one another form continuous regions constituting the first p$^+$-type base regions 3. An impurity concentration of the upper first p$^+$-type base regions 3b is set to become, for example, about $5\times10^{18}$/cm$^3$.

Figure 12:
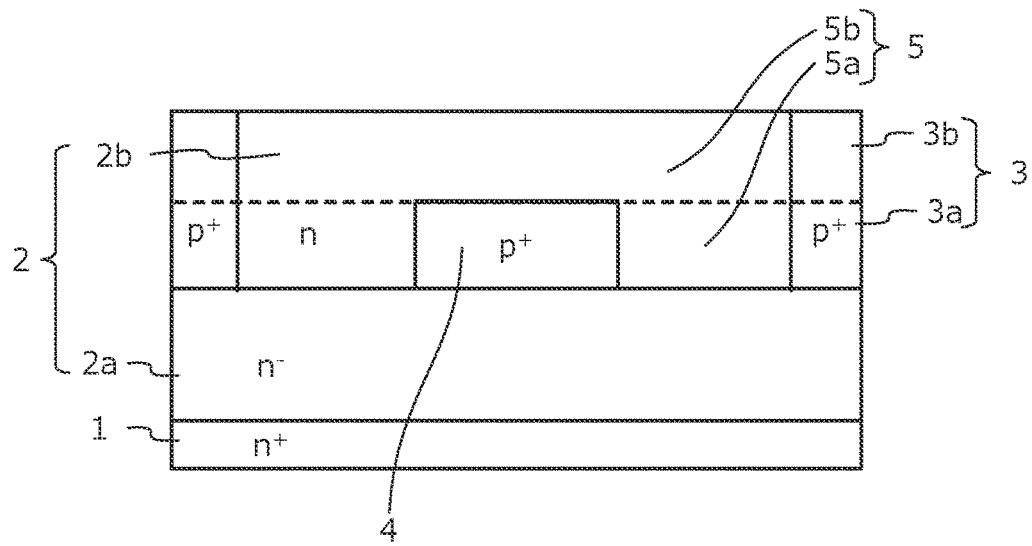
FIG. 12 is a cross-sectional view depicting a state of the silicon carbide semiconductor device according to the first embodiment during manufacture.

Next, portions of the ion implantation mask may be removed and an n-type impurity such as nitrogen may be ion-implanted in the openings, whereby in portions of the surface region of the n$^-$-type silicon carbide epitaxial layer 2, upper n-type high-concentration regions 5b of a depth of, for example, about 0.5 μm may be formed. An impurity concentration of the upper n-type high-concentration regions 5b is set to be, for example, about $1\times10^{17}$/cm$^3$. The upper n-type high-concentration regions 5b and the lower n-type high-concentration regions 5a are formed so as to at least partially contact one another, whereby the n-type high-concentration regions 5 are formed. Nonetheless, the n-type high-concentration regions 5 may be provided in an entire area of the substrate surface or may be formed in the active region through which a main current flows and an outer periphery of the active region may be free of the n-type high-concentration regions 5. The state up to here is depicted in FIG. 12.

Next, on the surface of the n$^-$-type silicon carbide epitaxial layer 2, the p-type base layer 6 having a thickness of about 1.1 μm is formed by epitaxial growth. An impurity concentration of the p-type base layer 6 is set to be in a range from about $5\times10^{15}$/cm$^3$ to $5\times10^{16}$/cm$^3$.

Figure 13:
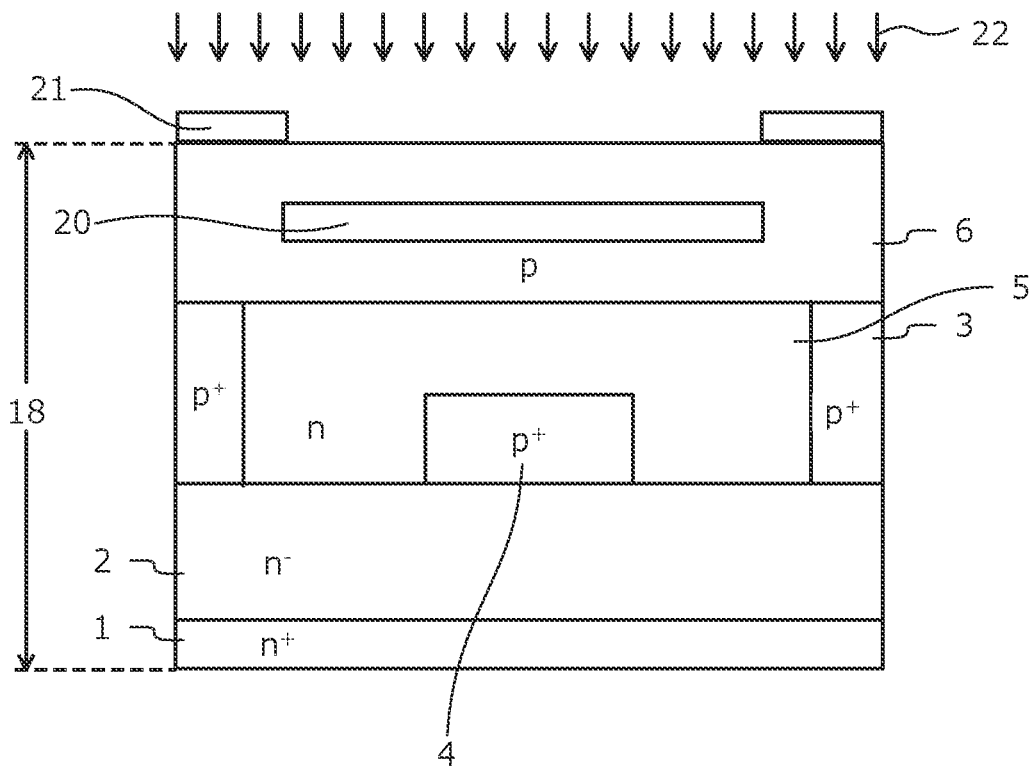
FIG. 13 is a cross-sectional view depicting a state of the silicon carbide semiconductor device according to the first embodiment during manufacture.

Next, on the surface of the p-type base layer 6, an ion implantation mask 21 having predetermined openings is formed by photolithography using, for example, an oxide film. The ion implantation mask 21 has openings corresponding to regions where the n$^+$-type source regions 7 are to be formed. Therefore, the ion implantation mask 21 is formed on regions where the p$^+$-type contact regions 8 and the Schottky metal 23 are formed. Subsequently, a p-type impurity such as aluminum is ion-implanted in the openings of the ion implantation mask 21 by an implantation 22, whereby the channel implant portions 20 are formed in the p-type base layer 6. As a result, the channel implant portions 20 may be provided only in vicinities of MOS channels. An impurity concentration of the channel implant portions 20 is set to be about $1\times10^{17}$/cm$^3$. The state up to here is depicted in FIG. 13.

Next, in a first main surface layer (surface layer having the p-type base layer 6) of the silicon carbide semiconductor base 18, predetermined regions configuring the MOS gates are formed. In particular, on the surface of the p-type base layer 6, an ion implantation mask having predetermined openings is formed by photolithography using, for example, an oxide film. An n-type impurity such as nitrogen (N) or phosphorus (P) is ion-implanted in the openings, whereby the n$^+$-type source regions 7 are formed in portions of the p-type base layer 6, at the surface thereof. Next, the ion implantation mask used to form the n$^+$-type source regions 7 may be removed and by a similar method, an ion implantation mask having predetermined openings may be formed, and a p-type impurity such as boron may be ion-implanted in portions of the p-type base layer 6, at the surface thereof, whereby the p$^+$-type contact regions 8 may be formed. An impurity concentration of the p$^+$-type contact regions 8 may be set to become higher than the impurity concentration of the p-type base layer 6.

Figure 14:
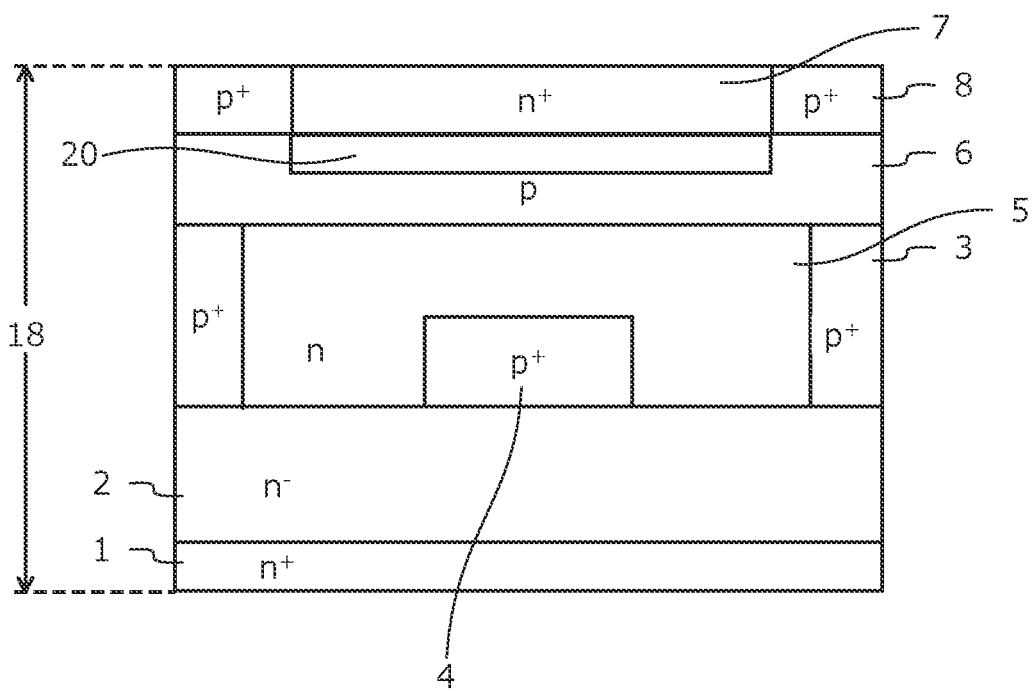
FIG. 14 is a cross-sectional view depicting a state of the silicon carbide semiconductor device according to the first embodiment during manufacture.

Next, a heat treatment (activation annealing) for activating all regions formed by ion implantation is performed. For example, a heat treatment (annealing) is performed under an inert gas atmosphere at about 1700 degrees C., whereby an activation process for the first p$^+$-type base regions 3, the second p$^+$-type base regions 4, the n$^+$-type source regions 7, and the p$^+$-type contact regions 8 is implemented. As described above, the ion implanted regions may be activated collectively by a single session of the heat treatment, or the heat treatment may be performed each time ion implantation is performed. The state up to here is depicted in FIG. 14.

Next, on the surface of the p-type base layer 6, a trench formation mask having predetermined openings is formed by photolithography using, for example, an oxide film. Next, the trenches 16 that penetrate through the p-type base layer 6 and reach the n-type high-concentration regions 5 (2) are formed by dry etching. The bottoms of the trenches 16 may respectively reach the second p$^+$-type base regions 4 formed in the n-type high-concentration regions 5 (2). Next, the trench formation mask is removed. Next, on the front surface of the silicon carbide semiconductor base 18, for example, RCA cleaning (wet cleaning using a strong acid and high base solution) is performed.

Next, the gate insulating films 9 are formed along the surfaces of the n$^+$-type source regions 7 and the bottoms and the sidewalls of the trenches 16. First, an oxide film is deposited in the trenches by a chemical reaction (chemical vapor deposition method) such as that for a high temperature oxide (HTO) or by thermal oxidation at a temperature of about 1000 degrees C., under an oxygen atmosphere.

Figure 15:
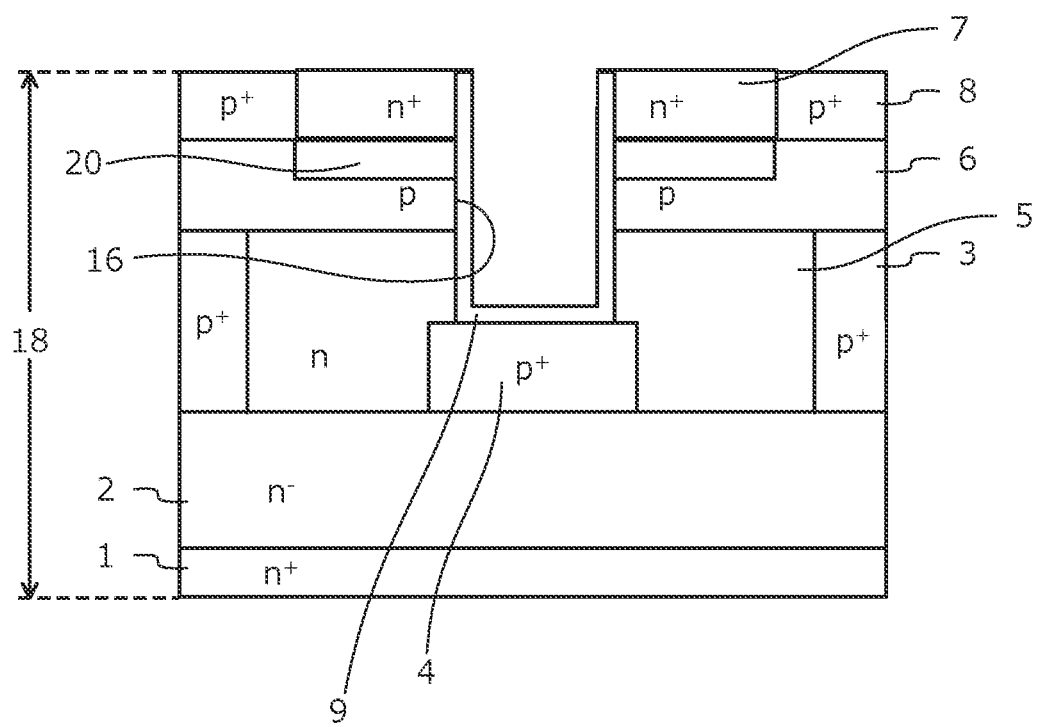
FIG. 15 is a cross-sectional view depicting a state of the silicon carbide semiconductor device according to the first embodiment during manufacture.

Next, sacrificial oxidation for rounding corners of the trench openings and the trench bottoms may be performed. Next, an annealing treatment is performed to the oxide film. In an instance of formation by thermal oxidation, the interface state density of interfaces between semiconductor portions and the oxide film may be reduced by a heat treatment (post oxidation annealing (POA) treatment). When the oxide film is formed by a deposition method such as that for a HTO, to improve electrical characteristics (mobility, etc.), generally, after HTO deposition, post-annealing by a gas containing nitrogen (N$_2$) or the like is performed. For example, NO annealing by a NO10%/N$_2$ gas is performed for about 30 minutes at a temperature of 1300 degrees C. As a result, the gate insulating films 9 are formed. The state up to here is depicted in FIG. 15.

Next, on the gate insulating films 9, a polycrystalline silicon layer doped with, for example, phosphorus atoms is provided. The polycrystalline silicon layer may be formed so as to be embedded in the trenches 16. The polycrystalline silicon layer is patterned by photolithography and left in the trenches 16, whereby the gate electrodes 10 are formed.

Next, for example, by a physical vapor deposition (PVD) method such as sputtering, a titanium film (not depicted) is formed in an entire area of the front surface of the silicon carbide semiconductor base 18. A thickness of the titanium film may be, for example, about 100 nm.

Next, for example, by a heat treatment of about 10 minutes at a temperature of about 500 degrees C., the titanium film is sintered. By the heat treatment, a Schottky junction between the titanium film and the p-type base layer 6 is formed. Next, the titanium film is selectively removed by photolithography and etching, whereby the Schottky metal 23 is formed. Here, the Schottky metal 23 suffices to be a metal that forms a Schottky junction with SiC and may be a metal other than Ti and, for example, the Schottky metal 23 may be formed using nickel (Ni).

Next, for example, phosphate glass having a thickness of about 1 μm is deposited so as to cover the Schottky metal 23, the gate insulating films 9, and the gate electrodes 10, whereby the interlayer insulating film 11 is formed. Next, the barrier metal 14 containing titanium (Ti) or titanium nitride (TiN) may be formed so as to cover the interlayer insulating film 11. The interlayer insulating film 11 and the gate insulating films 9 are patterned by photolithography, thereby forming contact holes that expose the n$^+$-type source regions 7 and the p$^+$-type contact regions 8. Thereafter, a heat treatment (reflow) is performed, whereby the interlayer insulating film 11 is planarized.

Next, the interlayer insulating film 11 is selectively removed and a nickel (Ni) or Ti film is deposited on the surface of the silicon carbide semiconductor base 18. Next, the surface is protected and a Ni or a Ti film is deposited on the back surface of the n$^+$-type silicon carbide substrate 1. Next, a heat treatment of about 1000 degrees C. is performed, whereby ohmic electrodes are formed respectively on the front surface side of the silicon carbide semiconductor base 18 and the back surface of the n$^+$-type silicon carbide substrate 1.

Next, a conductive film constituting the source electrode 12 is provided on the interlayer insulating film 11 and is provided so as to be in contact with ohmic electrode portions formed in the contact holes, thereby putting the n$^+$-type source regions 7 and the p$^+$-type contact regions 8 in contact with the source electrode 12.

Next, on the second main surface of the n$^+$-type silicon carbide substrate 1, the back electrode 13 constituted by, for example, a nickel (Ni) film is formed. Thereafter, a heat treatment is performed at a temperature of, for example, about 970 degrees C., whereby an ohmic contact is formed between the n$^+$-type silicon carbide substrate 1 and the back electrode 13.

Next, for example, by a sputtering method, on the source electrode 12 of the front surface of the silicon carbide semiconductor base 18 and in the openings of the interlayer insulating film 11, an electrode pad constituting the source electrode pad (not depicted) is deposited. A thickness of a portion of the electrode pad on the interlayer insulating film 11 may be, for example, 5 μm. The electrode pad, for example, may be formed using aluminum (Al—Si) containing 1% of silicon. Next, the source electrode pad is selectively removed.

Next, on the surface of the back electrode 13, for example, titanium (Ti), nickel (Ni), and gold (Au) are deposited in this sequence as the drain electrode pad (not depicted). Thus, as described, the semiconductor device depicted in FIG. 1 is completed.

As described above, according to the first embodiment, the channel implant portions are formed only near the sidewalls of the trenches where channels are formed. As a result, during reverse conduction, electron current easily penetrates the p-type base layer and electrons reaching the p-type base layer may be led out. Therefore, the ratio of the electron current to the total current increases, whereby the accumulated hole amount for the same current density may be reduced and bipolar degradation of the silicon carbide MOSFET may be suppressed.

Further, the Schottky metal that forms Schottky junctions with the p-type base layer is provided on portions of the p-type base layer where the channel implantation is not performed. As a result, an electrode that electron current reaches may be constituted by the Schottky metal, leak current during reverse bias is suppressed, and the breakdown voltage may be maintained.

Figure 16:
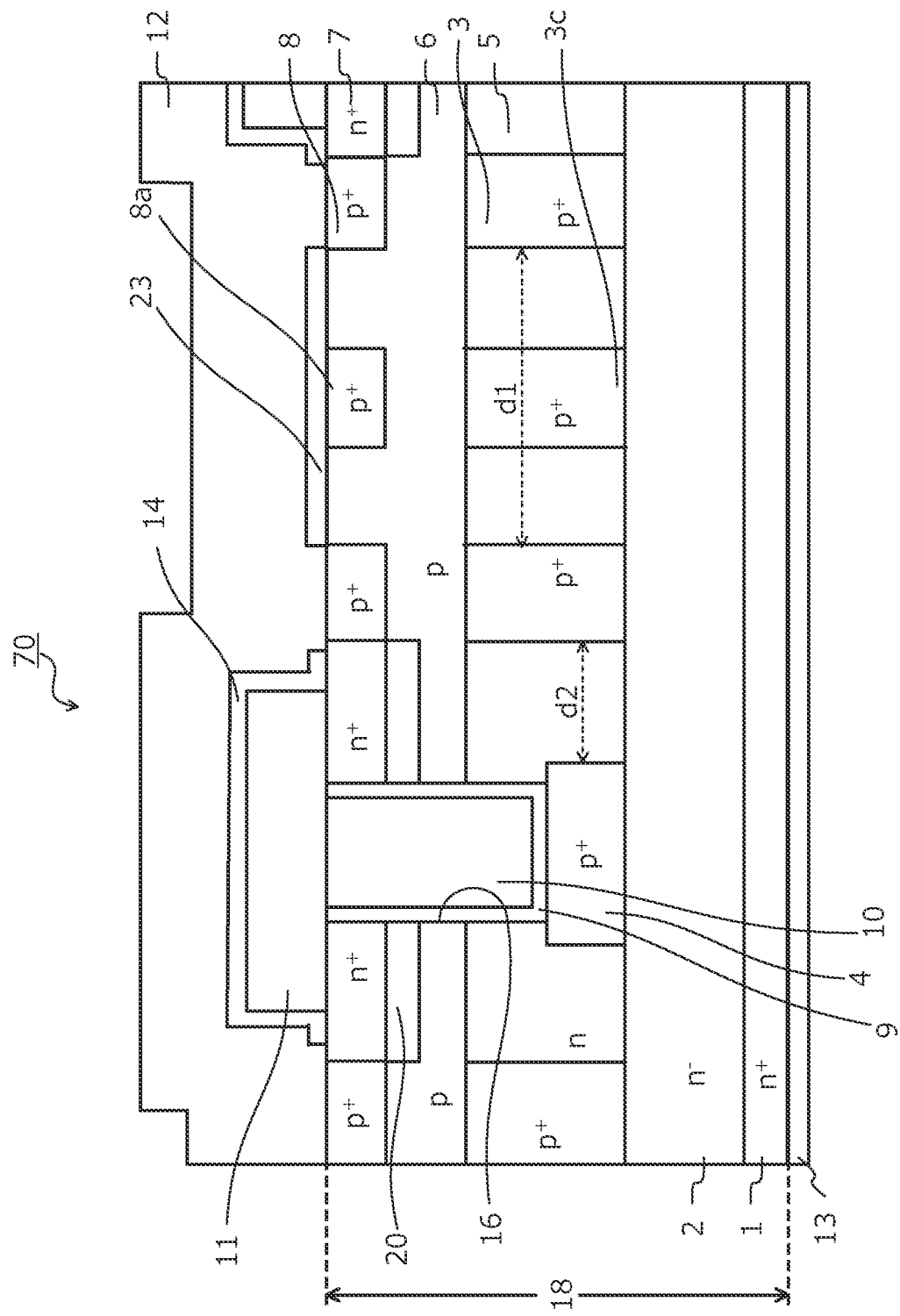
FIG. 16 is a cross-sectional view depicting a structure of a silicon carbide semiconductor device according to a second embodiment.
Figure 17:
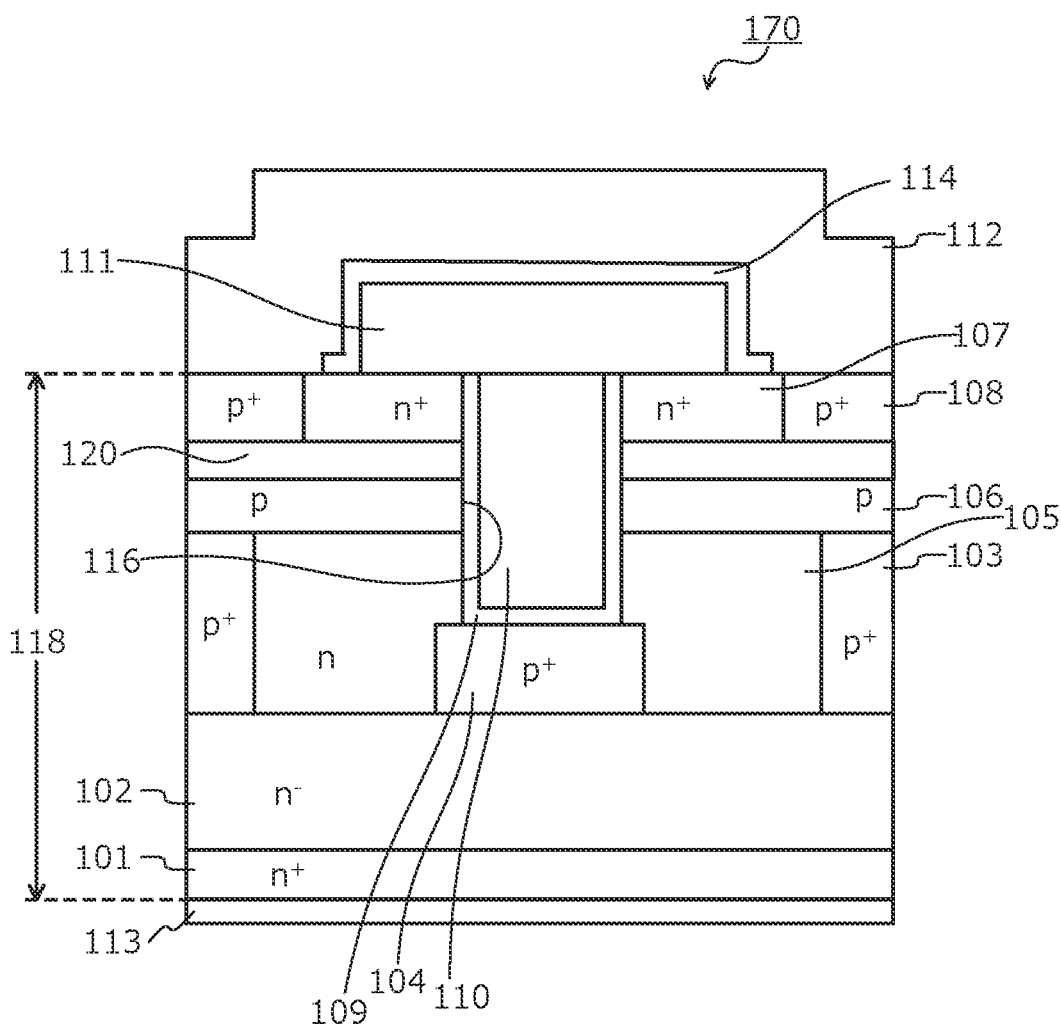
FIG. 17 is a cross-sectional view depicting a structure of a conventional silicon carbide semiconductor device.

FIG. 16 is a cross-sectional view depicting a structure of a silicon carbide semiconductor device according to a second embodiment. As depicted in FIG. 16, the silicon carbide semiconductor device according to the second embodiment, differs from the silicon carbide semiconductor device according to the first embodiment in that Schottky-portion p$^+$-type contact regions 8$a$ and Schottky-portion first p$^+$-type base regions 3$c$ are provided at positions corresponding to the Schottky metal 23 in the depth direction.

The Schottky-portion p$^+$-type contact regions 8$a$ are provided in a surface layer of the p-type base layer 6 and the Schottky-portion first p$^+$-type base regions 3$c$ are provided in the n-type high-concentration regions 5 (2). The Schottky-portion p$^+$-type contact regions 8$a$ and the Schottky-portion first p$^+$-type base regions 3$c$ are provided, whereby even in regions below the Schottky metal 23, electric field strength may be reduced and application of high electric field to portions of the gate insulating films 9 along the bottoms of the trenches 16 may be prevented.

Further, when a width d1 of an area occupied by the Schottky metal 23 is large, electric field in regions below the Schottky metal 23 increases and therefore, in an instance in which the width d1 is large, preferably, the Schottky-portion first $p^+$-type base regions $3c$ and the Schottky-portion $p^+$-type contact regions $8a$ may be provided. For example, when the width d1 of an area occupied by the Schottky metal 23 is greater than a distance d2 between one of the first $p^+$-type base regions 3 and one of the second $p^+$-type base regions 4, preferably, the Schottky-portion first $p^+$-type base regions $3c$ and the Schottky-portion $p^+$-type contact regions $8a$ may be provided.

Further, the silicon carbide semiconductor device according to the second embodiment may be manufactured by a same method as that for manufacturing the silicon carbide semiconductor device according to the first embodiment by forming the Schottky-portion first $p^+$-type base regions $3c$ and the Schottky-portion $p^+$-type contact regions $8a$ by a same method as that for the first $p^+$-type base regions 3 and the $p^+$-type contact regions 8.

As described above, according to the second embodiment, the Schottky-portion $p^+$-type contact regions and the Schottky-portion first $p^+$-type base regions are provided at positions corresponding, in the depth direction, to areas occupied by the Schottky metal. As a result, even in regions below the Schottky metal, the electric field strength may be reduced and application of high electric field to portions of the gate insulating films along the trench bottoms may be prevented.

In the foregoing, the present invention may be variously modified within a range not departing from the spirit of the invention and in the embodiments described above, for example, dimensions and impurity concentrations of parts, etc. may be variously set according to necessary specifications. Further, in the embodiments, while the first conductivity type is assumed to be an n-type and the second conductivity type is assumed to be a p-type, the present invention is similarly implemented when the first conductivity type is a p-type, and the second conductivity type is an n-type.

According to the invention described above, channel implant portions are formed only near the sidewalls of the trenches where channels are formed. As a result, during reverse conduction, electron current easily penetrates the p-type base layer (second semiconductor layer of a second conductivity type) and electrons reaching the p-type base layer may be led out. Therefore, the ratio of the electron current to the total current increases, whereby the accumulated hole amount for the same current density may be reduced and bipolar degradation of the silicon carbide MOSFET may be suppressed.

Further, the Schottky metal (third electrodes) that forms Schottky junctions with the p-type base layer is provided on portions of the p-type base layer where the channel implantation is not performed. As a result, electrodes that electron current reaches may be constituted by the Schottky metal, leak current during reverse bias is suppressed, and the breakdown voltage may be maintained.

The silicon carbide semiconductor device according to the present invention achieves an effect in that current reaching the p-type base layer is led out, hole injection to the drift layer is suppressed, and hole density may be reduced.

As described above, the silicon carbide semiconductor device and the method of manufacturing the silicon carbide semiconductor device according to the present invention are useful for power semiconductor devices used in power converting equipment such as inverters, power source devices such as for various types of industrial machines, igniters of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide semiconductor substrate of a first conductivity type, having a first main surface and a second main surface opposite to each other;
   a first semiconductor layer of the first conductivity type, provided on the first main surface of the silicon carbide semiconductor substrate, the first semiconductor layer having an impurity concentration lower than an impurity concentration of the silicon carbide semiconductor substrate, the first semiconductor layer having a first surface and a second surface opposite to each other, the second surface facing the silicon carbide semiconductor substrate;
   a second semiconductor layer of a second conductivity type, provided on the first surface of the first semiconductor layer, the second semiconductor layer having a first surface and a second surface opposite to each other, the second surface of the second semiconductor layer facing the first semiconductor layer;
   a plurality of first semiconductor regions of the first conductivity type, selectively provided in the second semiconductor layer at the first surface of the second semiconductor layer;
   a plurality of second semiconductor regions of the second conductivity type, selectively provided in the second semiconductor layer at the first surface thereof, in contact with first semiconductor regions;
   a plurality of third semiconductor regions of the second conductivity type, respectively provided in the second semiconductor layer and facing the first semiconductor regions in a depth direction of the silicon carbide semiconductor device, the third semiconductor regions each having an impurity concentration higher than an impurity concentration of the second semiconductor layer;
   a plurality of trenches penetrating the second semiconductor layer through the first semiconductor regions, and reaching the first semiconductor layer;
   a plurality of gate electrodes respectively provided in the trenches via a plurality of gate insulating films;
   an interlayer insulating film provided on the gate electrodes;
   a first electrode provided on surfaces of the first semiconductor regions and the second semiconductor regions;
   a second electrode provided on the second main surface of the silicon carbide semiconductor substrate; and
   a plurality of third electrodes provided on the first surface of portions of the second semiconductor layer free of the third semiconductor regions, each of the third electrodes forming a Schottky junction with the second semiconductor layer.

2. The silicon carbide semiconductor device according to claim 1, further comprising:
   a plurality of fourth semiconductor regions of the second conductivity type, selectively provided in the first semiconductor layer at the first surface of the first semiconductor layer; and
   a plurality of fifth semiconductor regions of the second conductivity type, selectively provided at positions facing the trenches of the first semiconductor layer in the depth direction, wherein one of the second semiconductor regions and one of the fourth semiconductor regions face one of the third electrodes in the depth direction.

3. The silicon carbide semiconductor device according to claim 2, wherein each of the third electrodes has a width greater than a distance between another one of the fourth semiconductor regions and one of the fifth semiconductor regions.

4. The silicon carbide semiconductor device according to claim 1, wherein each of the third semiconductor regions has a width greater than a width of each of the first semiconductor regions.

5. The silicon carbide semiconductor device according to claim 1, wherein each of the third electrodes is provided on the first surface of the second semiconductor layer, between adjacent two of the second semiconductor regions.

* * * * *